(12) United States Patent
Kister

(10) Patent No.: US 7,148,709 B2
(45) Date of Patent: Dec. 12, 2006

(54) FREELY DEFLECTING KNEE PROBE WITH CONTROLLED SCRUB MOTION

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 57 days.

(21) Appl. No.: 10/850,921

(22) Filed: May 21, 2004

(65) Prior Publication Data

US 2005/0258844 A1 Nov. 24, 2005

(51) Int. Cl.
*G01R 31/32* (2006.01)
(52) U.S. Cl. .................... 324/754; 324/761
(58) Field of Classification Search ........ 324/754–762; 439/482, 824; 29/825, 830
See application file for complete search history.

(56) References Cited

U.S. PATENT DOCUMENTS

| | | | |
|---|---|---|---|
| 4,773,877 A | * 9/1988 | Kruger et al. | 439/482 |
| 4,967,148 A | * 10/1990 | Doemens et al. | 324/754 |
| 5,923,178 A | 7/1999 | Higgins et al. | 324/754 |
| 5,952,843 A | * 9/1999 | Vinh | 324/761 |
| 6,633,176 B1 | * 10/2003 | Takemoto et al. | 324/754 |

\* cited by examiner

*Primary Examiner*—Vinh P. Nguyen
(74) *Attorney, Agent, or Firm*—Lumen Intellectual Property Services, Inc.

(57) ABSTRACT

A rigid column and a suspension knee are combined in a probe held in assembly via its column. The suspension knee has a base arm laterally connecting at and propagating away from the column. The base arm extends up to a lateral knee extension where a reverse arm continues from the base arm back in direction towards a central axis of the column. The reverse arm terminates in a contact tip in a tip offset to the column axis that is smaller than the lateral knee extension. During application of a contacting force onto the contact tip, a first deflection of the base arm and a second deflection of the reverse arm counter act in conjunction with base and reverse arms' structural configurations. As a result, scrub motion may be well defined in direction and magnitude without need for additional guidance of the deflecting probe structure.

21 Claims, 18 Drawing Sheets

(6 of 18 Drawing Sheet(s) Filed in Color)

FREELY DEFLECTING KNEE PROBE WITH CONTROLLED SCRUB MOTION

FIELD OF INVENTION

The present invention relates to probes for testing electronic circuitry. Particularly, the present invention relates to vertical probes having a rigid columnar structure and a suspension knee for controlled scrub motion.

BACKGROUND OF INVENTION

In the field of electronic circuitry testing, scrubbing and contact force is an important factor in establishing a low resistance electrical contact between a probe tip and the test contact. During scrubbing, an insulating oxide layer is removed in the interface between the contact tip and the test contact. Scrubbing is a microscopic shear movement of the probe tip along the test contact surface while a certain pressure is exerted from the probe tip onto the test contact. As size and pitch of test contacts decrease, it becomes increasingly difficult to tune the scrub motion irrespective of friction influences in the tip/contact interface. Also, as the IC manufacturers incorporate designs with I.C. pads and bumps placed over chip's active circuitry it becomes important that the scrub of the probe does not cause damage to the underlying circuitry. The size of the window of acceptable probe operation therefore, is restrained from one side by the contact resistance requirements calling for a sizable scrub, smaller scrub size required by smaller targets that need to be probed as pitches decrease, and smaller scrub (including depth) to avoid damage to the underlying circuitry.

The new generation of I.C. chips has pads that are placed over active circuitry in order to maximize use of the real estate. These types of chips are commonly referred in the industry as chips with "low-K dielectric". The low-K dielectric refers to the fragile polymer-based insulator now placed between the pads and the underlying circuits for electrical purposes. It is not acceptable to damage the low-K dielectric during probing operations either.

In the prior art, well known buckling beam probes have been utilized to provide a combined resilient deflection and scrubbing. In order for a buckling beam probe to operate properly with a well defined scrub motion it needs to be rigidly held on its peripheral shaft and additionally guided close to the contact tip. This makes the buckling beam probe's assembly increasingly challenging with ever decreasing scale. Therefore, there exists a need for a probe that may be easily assembled in large numbers and small scale while providing a well definable scrub motion. The present invention addresses this need.

SUMMARY

A preferably vertically assembled probe features a substantially rigid columnar structure and a connected suspension knee. The probe is held in assembly via its columnar structure. The suspension knee has a base arm laterally connecting at and propagating away from a connect end of the columnar structure. The base arm extends up to a lateral knee extension where a reverse arm continues from the base arm back in direction towards a central axis of the columnar structure. The reverse arm terminates in a contact tip in a tip offset to the column axis that is smaller than the lateral knee extension. During application of a contacting force onto the contact tip, a first deflection of the base arm and a second deflection of the reverse arm counter act in conjunction with base and reverse arms structural configuration. As a result, scrub motion may be well defined in direction and magnitude without need for additional guidance of the deflecting probe structure.

The entire probe is preferably symmetric with respect to a symmetry plane through the column axis and a tip axis, which is central with respect to a contacting face of the contact tip. The probe has preferably a continuous profile in direction normal to the symmetry plane fabricated for example by electroplating. Base and reverse arms are preferably linearly protruding with a knee bend in between, which results in combination with continuous probe profile in a scrub motion highly in plane with the symmetry plane.

The probes may be arrayed with tight pitch that is less than the total width of the probe. Adjacent suspension knees may overlap while leaving sufficient clearance. The probes may be assembled via their columnar structures for example in a sandwiching fixture and clamping plates that provide a shearing clamping of the columnar structures. The probes may be also simultaneously fabricated in a probe comb including a number of probes linearly arrayed with final assembly pitch and held together by a bridge connecting to each of the arrayed probes on the peripheral end of the columnar structure. The bridge may be removed after a number of probe combs are stacked and fixed with respect to each other.

BRIEF DESCRIPTION OF THE FIGURES

The patent or application file contains at least one drawing executed in color. Copies of this patent or patent application publication with color drawing(s) will be provided by the Office upon the request and payment of the necessary fee.

DETAILED DESCRIPTION

Figure 1:
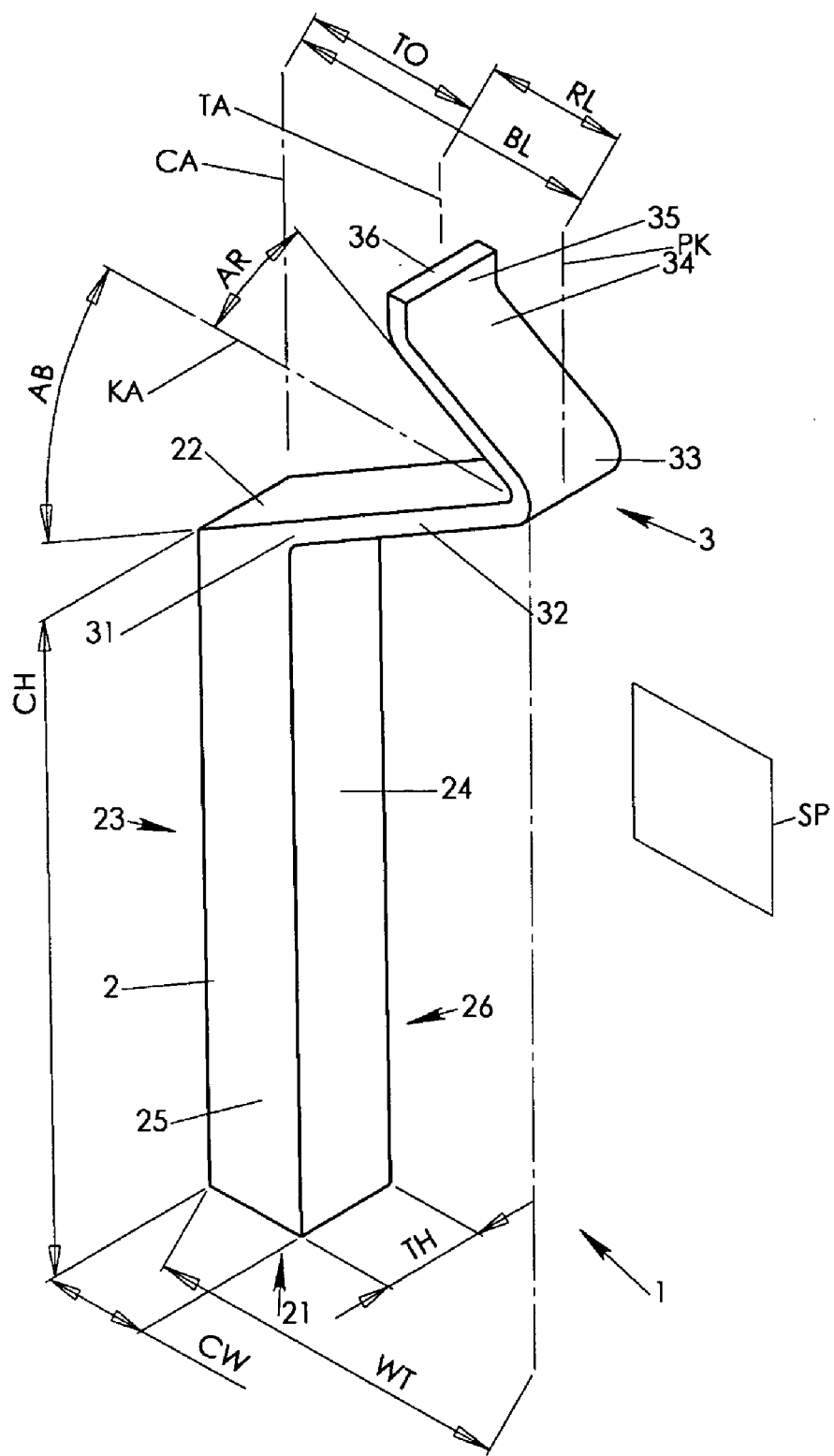
FIG. 1 is a first perspective view of an exemplary probe in accordance with a preferred embodiment of the invention.

Referring to FIG. 1, a probe 1 in accordance with a preferred embodiment of the invention features a rigid columnar structure 2 having a peripheral end 21, a connect end 22, a knee opposing face 23, a connect face 24, a front face 25 and a back face 26. The columnar structure 2 is preferably symmetric with respect to a central column axis CA. At the connect end 22, a suspension knee 3 is laterally connecting via its base arm 32, which propagates away from the column axis CA substantially up to a lateral knee extension PK. A reverse arm 34 continues from the base arm 32. The reverse arm 34 propagates away from the lateral knee extension PK in direction towards the column axis CA with a reverse length RL. At the end of the reverse arm 34 is a contacting tip 35. The contacting tip 35 has a contacting face 36 with a tip axis TA central with respect to the contacting face 36. The tip axis TA is offset from the column axis CA in a tip offset TO. The tip offset TO is smaller than the lateral knee extension PK such that during application of a contacting force preferably along the tip axis TA a first deflection of the base arm 32 and a second deflection of the reverse arm 34 counteract, resulting in a predetermined scrub motion of the contacting tip 35. The suspension knee 3 is connected to the rigid columnar structure 2 via a suspension connect 31.

The probe 1 is preferably symmetric with respect to a symmetry plane SP that coincides with the column axis CA and the tip axis TA. As a preferred result, the scrub motion is substantially in plane with the symmetry plane SP. The probe 1 may have a continuous profile in direction perpendicular with respect to the symmetry plane SP such that the columnar structure 2 as well as the elements of the suspension knee 3 have substantially rectangular cross sections.

The columnar structure 2 has a first pair of adjacent faces and a second pair of adjacent faces, the first pair opposing the second pair. A first pair may be for example faces 24, 26 and a second pair may be faces 23, 25. The probe 1 may be fabricated in a layered fabrication technique such as well known electroplating in combination with negative shaped mask. Relevant dimensions of the probe 1 include probe thickness TH, total probe width WT, column width CW, column height CH, tip offset TO, lateral knee extension BL and reverse arm length RL. In the preferred case of substantially linearly protruding base arm 32 and/or reverse arm 34, relevant dimensions include also a base arm angle AB and reverse arm angle AR between a knee axis KA and their respective arms 32, 34. The knee axis KA is a geometric element coinciding with a center of a knee bend 33 referencing the orientation of the knee bend 33 with respect to the column axis CA. The knee axis may be utilized to characterize the displacement behavior of the suspension knee 3 as depicted in the spectral displacement plots of FIGS. 10, 12, 14, 16, 17, 19.

In FIGS. 1–8, the arms 32, 34 as well as the knee bend 33 and contacting tip 35 are depicted as having constant cross sections. Nevertheless, arms 32, 34, knee bend 33 and contacting tip 35 may have tuned configurations to provide a scrub motion predetermined in direction and magnitude in response to a contacting force exerted onto the contacting face 36 during operational contacting of the probe 1 with a test contact as is well known in the art. Such tuned configurations and their influence on the scrub motion are described in more detail under FIGS. 9–18.

Figure 2:
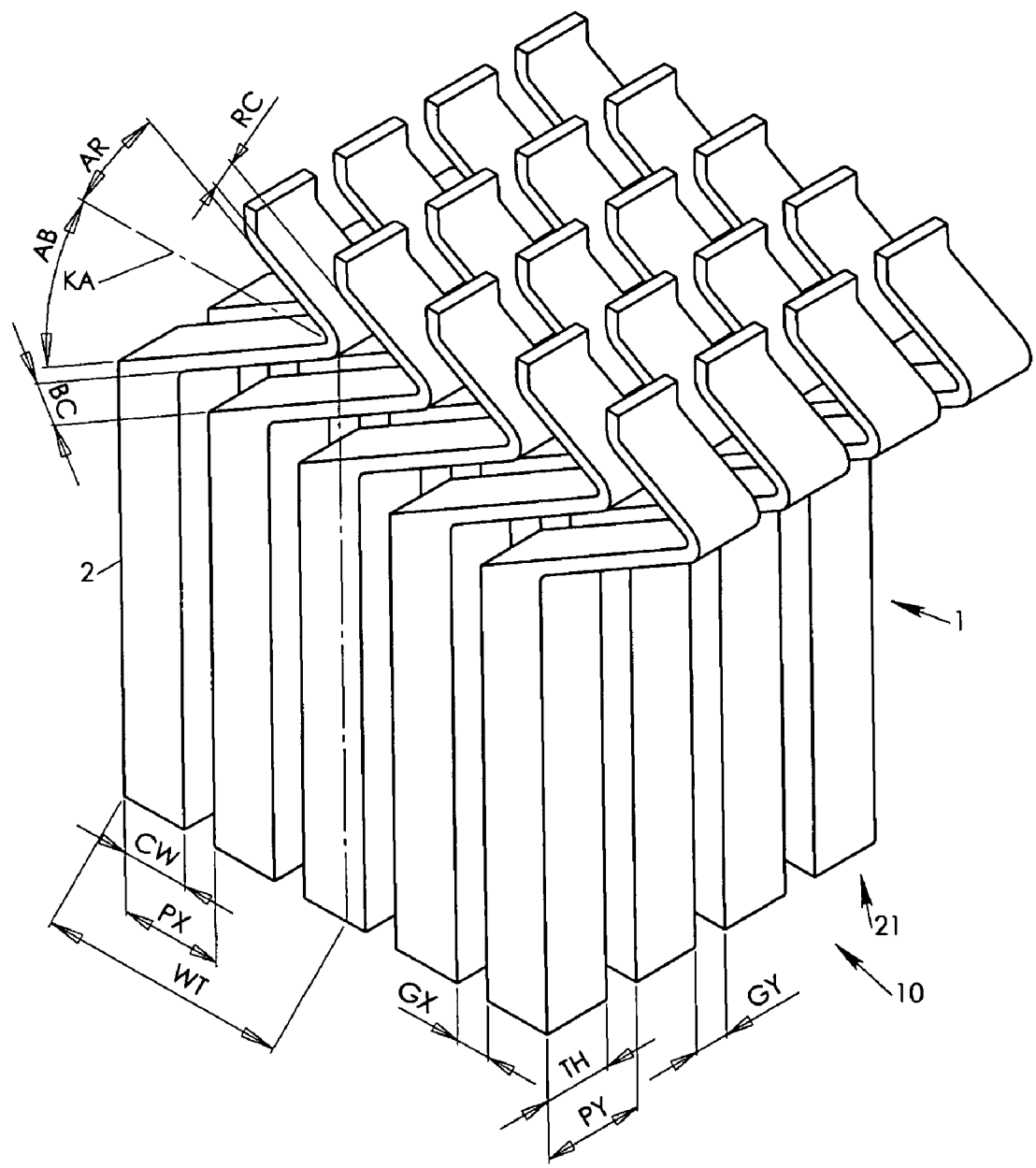
FIG. 2 is the first perspective view of a number of probes of FIG. 1 in exemplary assembly array.
Figure 3:
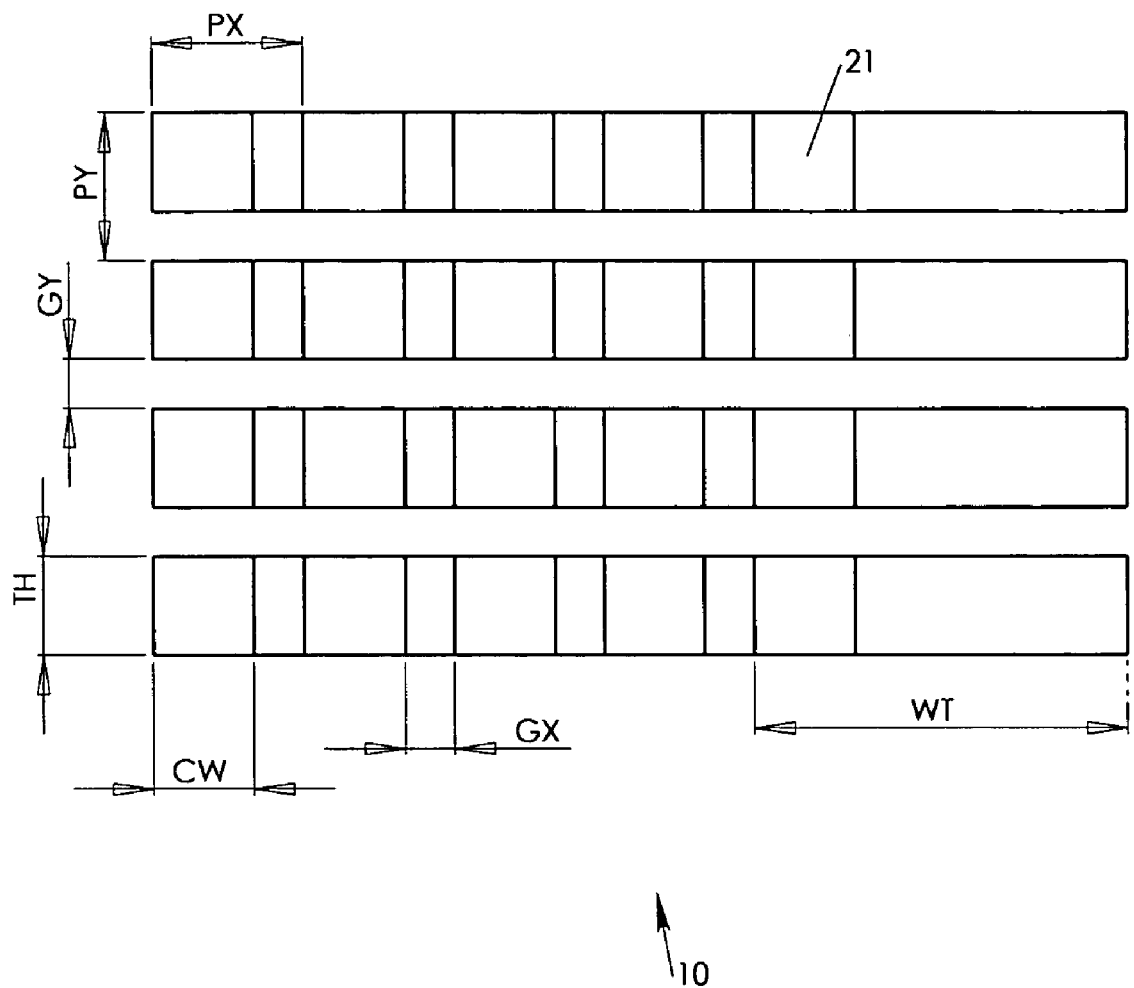
FIG. 3 is a top view of the probe array of FIG. 2.

Referring to FIGS. 2, 3, multiple representations of probe 1 may be arrayed with a first pitch PX that is substantially smaller than the total width WT. Base and reverse angles AB, AR are selected such that for a given first pitch PX sufficient base arm clearance BC and reverse arm clearance RC is established for an unimpeded deflection of each suspension knee 3 within the array. The first pitch PX may be selected in conjunction with the column width CW such that a first gap GX remains at a minimum required for an assembly for the arrayed probes 1.

Multiple representations of probe 1 may be arrayed in a two dimensional probe array 10 with the first pitch PX in a preferred direction parallel to the probes' 1 knee axes KA and a second pitch PY preferably perpendicular to the first pitch PX. The second pitch PY may be selected in conjunction with the probe thickness TH such that a second gap GY remains at a minimum required for an assembly for the arrayed probes 1. Providing the probes 1 in a configuration for a sole assembly via their rigid columnar structures 2 and for a scrub motion predetermined in direction and magnitude is highly advantageous for a tight interlaced array of the probes 1. For example, probes 1 having a probe thickness TH of about 2 mils, a total width WT of about 8 mils and a column width CW of about 2 mils may be assembled with a first pitch PX of about 4 mils and a second pitch of about 3 mils.

Referring to FIGS. 4–7, the probes 1 may be fixedly held in a probe assembly 100 including fixture plates 4 that may be combined and/or part of a well known probe apparatus for testing electronic circuitry. Each fixture plate 4 has a number of fixing cutouts 41 with a contour larger than the rectangular cross section of the columnar structure 2. Each fixing cutout 41 has two fixing faces 411, 412 that correspond to the first pair of adjacent faces 24, 25. The probe assembly further includes a clamping plate 5 having a number of clamping cutouts 51 also with a contour larger than the rectangular cross section of the columnar structure 2. Each clamping cutout 51 has two clamping faces 511, 512 that correspond to the second pair of adjacent faces 23, 26. Fixing cutouts 41 and clamping cutouts 51 are fabricated into their respective plates 4, 5 with pitches PX and PY.

Figure 4:
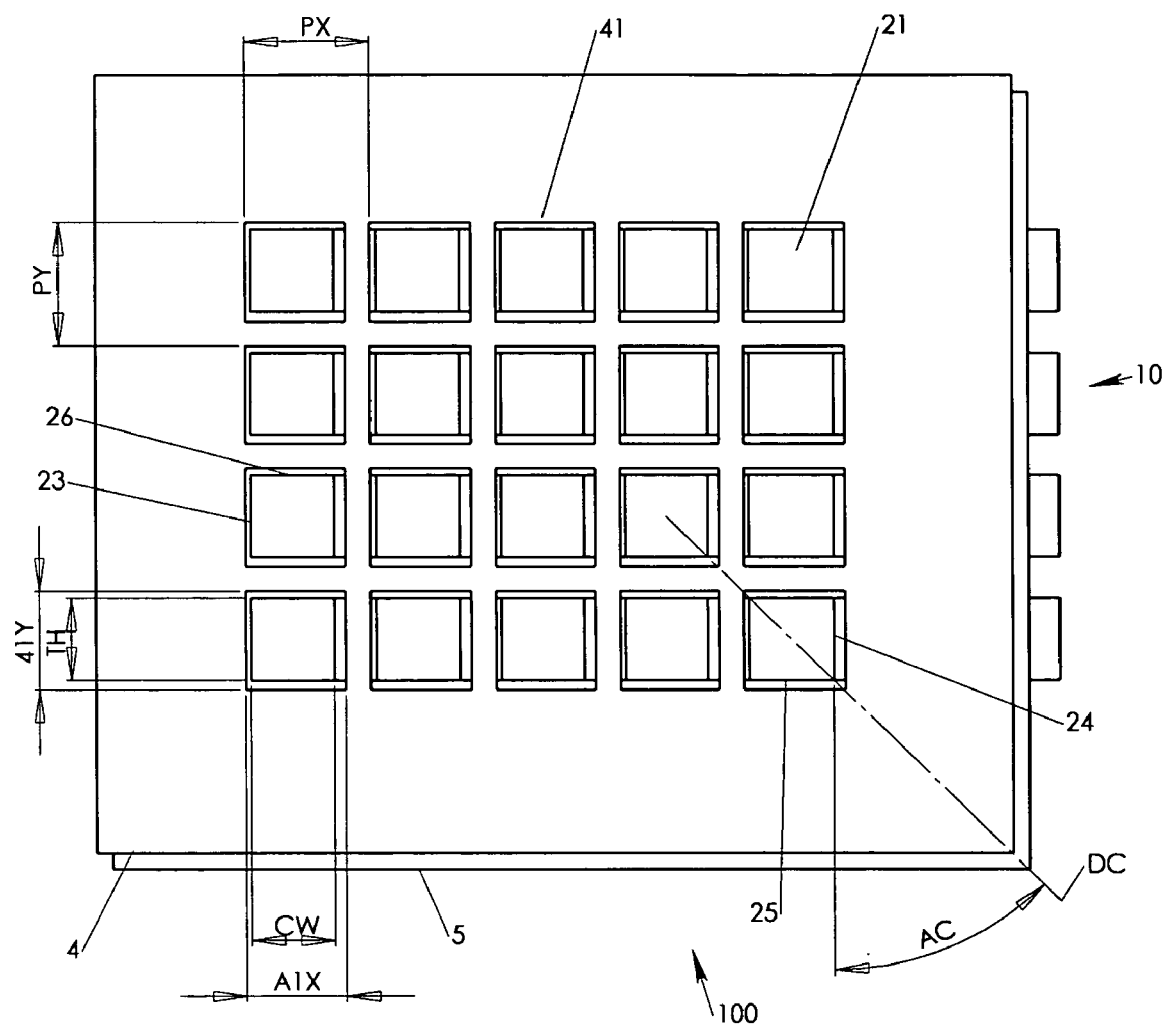
FIG. 4 is the top view of the probe array of FIG. 2 together with sandwiched fixture and clamping plate in aligned cutout position for probe insertion.
Figure 5:
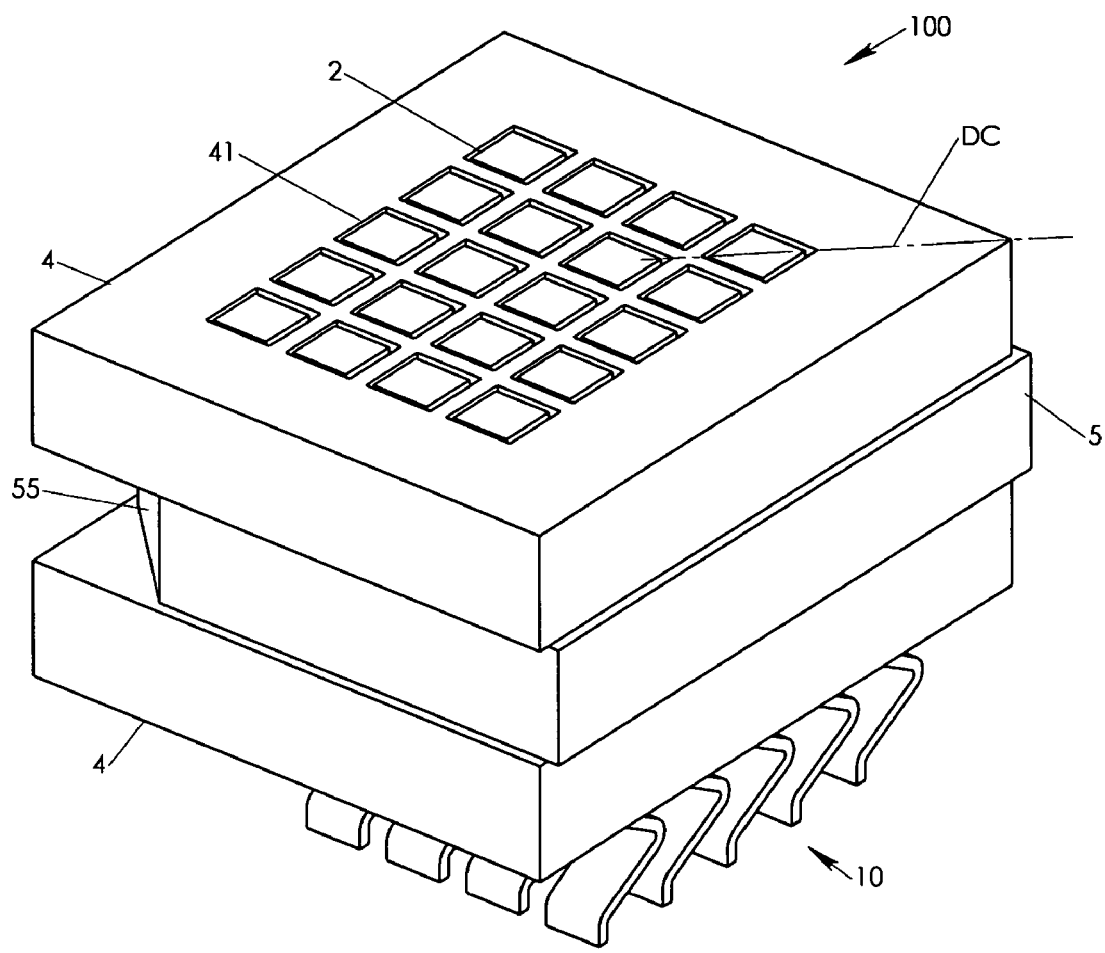
FIG. 5 is a second perspective view of the assembly of FIG. 4.
Figure 6:
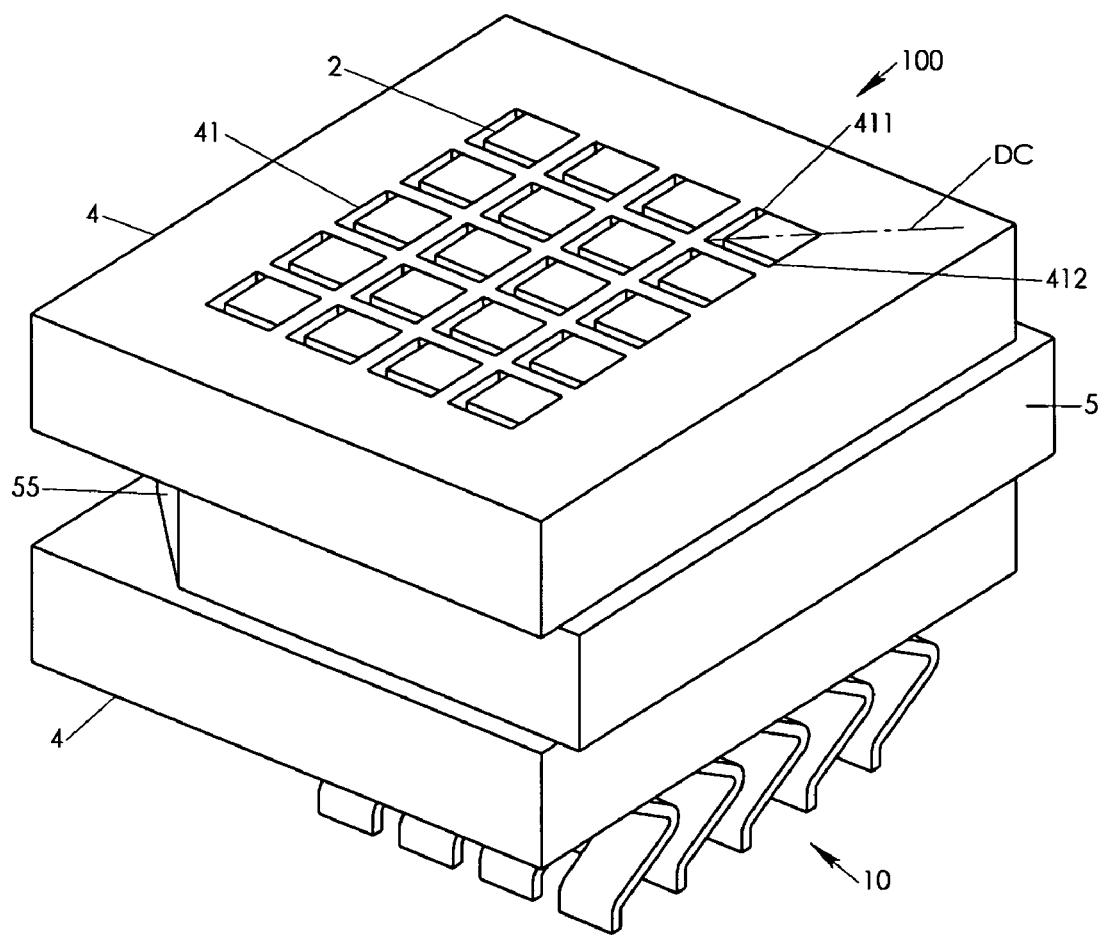
FIG. 6 is the second perspective view of the assembly of FIG. 5 in shear clamp configuration.
Figure 7:
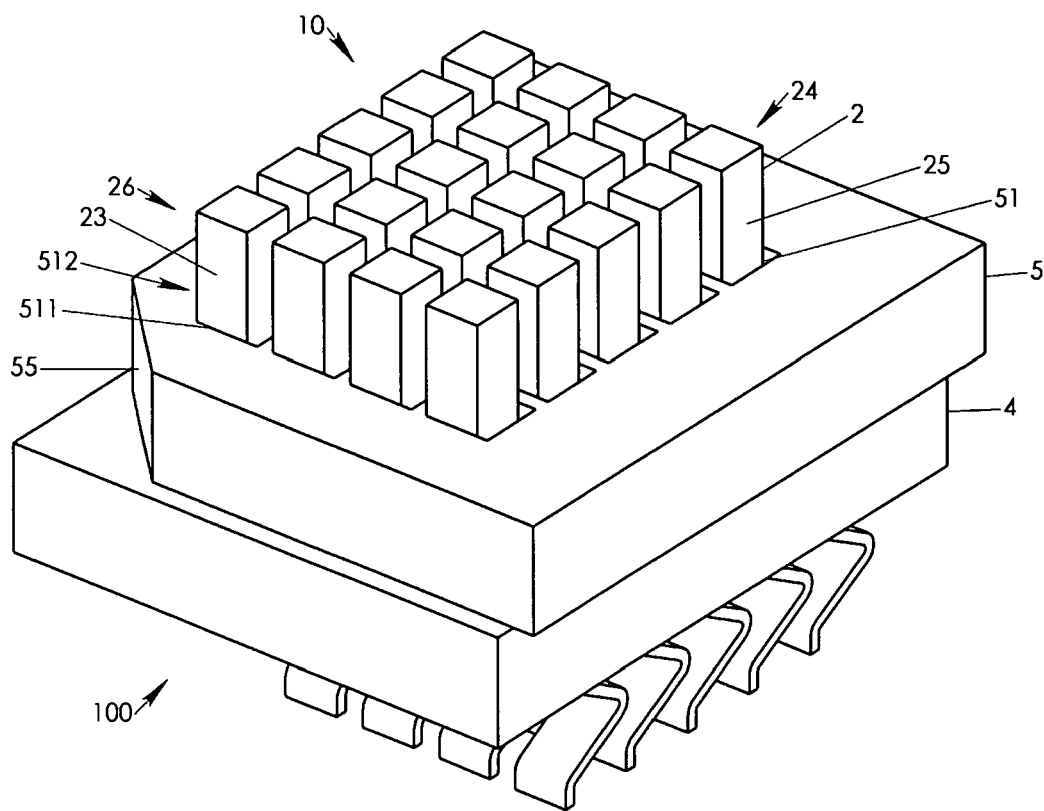
FIG. 7 is the second perspective view of the assembly of FIG. 6 with the top fixture plate being removed for illustration purpose.

The clamping plate may be held with respect to the fixture plates 4 in an assembly position as seen in FIGS. 4, 5 and a clamping position as seen in FIGS. 6, 7. In the assembly position, the clamping cutouts 51 align with the fixing cutouts 41 such that a columnar structure 2 may be inserted in the fixing cutouts 41 and the clamping cutouts 51. In the clamping position, the clamping plate 51 is offset in a clamp direction DC relative to its assembly position. The clamp direction DC is in a clamp angle AC which preferably corresponds approximately with a diagonal between the enclosed edges of the first pair of adjacent faces 24, 25 and the second pair of adjacent faces 23, 26. As a result of the angled clamping offset, the first pair of adjacent faces 24, 25 is forced into snug contact with the fixing faces 411, 412 and the second pair of adjacent faces 23, 26 is forced into snug contact with the clamping faces 511, 512 such that each probe is fixedly held in a predetermined pitch and orientation with respect to the fixture plates 4 and with respect to each other.

Plates 4, 5 may be fabricated from ceramic with the cutouts 41, 51 being deep trench etched as may be well appreciated by anyone skilled in the art. The clamping plate 5 may be forced into the clamping offset via any well known mechanical feature such as a screw pressing against a clamping access feature 55. The clamping direction DC is self adjusting as long as the clamping force is applied in direction approximately complying with the predetermined clamping direction DC as may be well appreciated by anyone skilled in the art. The clamping plate 5 may be actuated without particular guides. Assembly position stoppers may be provided for the clamping plate to warrant alignment of the clamping cutouts 51 with the fixing cutouts 41 in assembly position. Positioning of the probes 1 in direction along the column height CH may be provided via an auxiliary stop plate (not shown) temporarily placed adjacent opposite an insertion side of the plate assembly such that the peripheral ends 21 contact the stop plate once fully inserted into the cutouts 41, 51. After clamping, the stop plate may be removed. The probes 1 may be bonded in clamped position by an epoxy or other well known techniques. The cutouts 41, 51 may also be configured as conductively coated via holes conductively connected to peripheral terminals on the plates 41, and/or 51. The probes 1 may also be conductively accessed via well known wire bonding techniques bonding wires to the peripheral ends 21 as may be well appreciated by anyone skilled in the art. The fully fabricated probe assembly 100 may be inserted and/or assembled in a well known probe apparatus.

Figure 8:
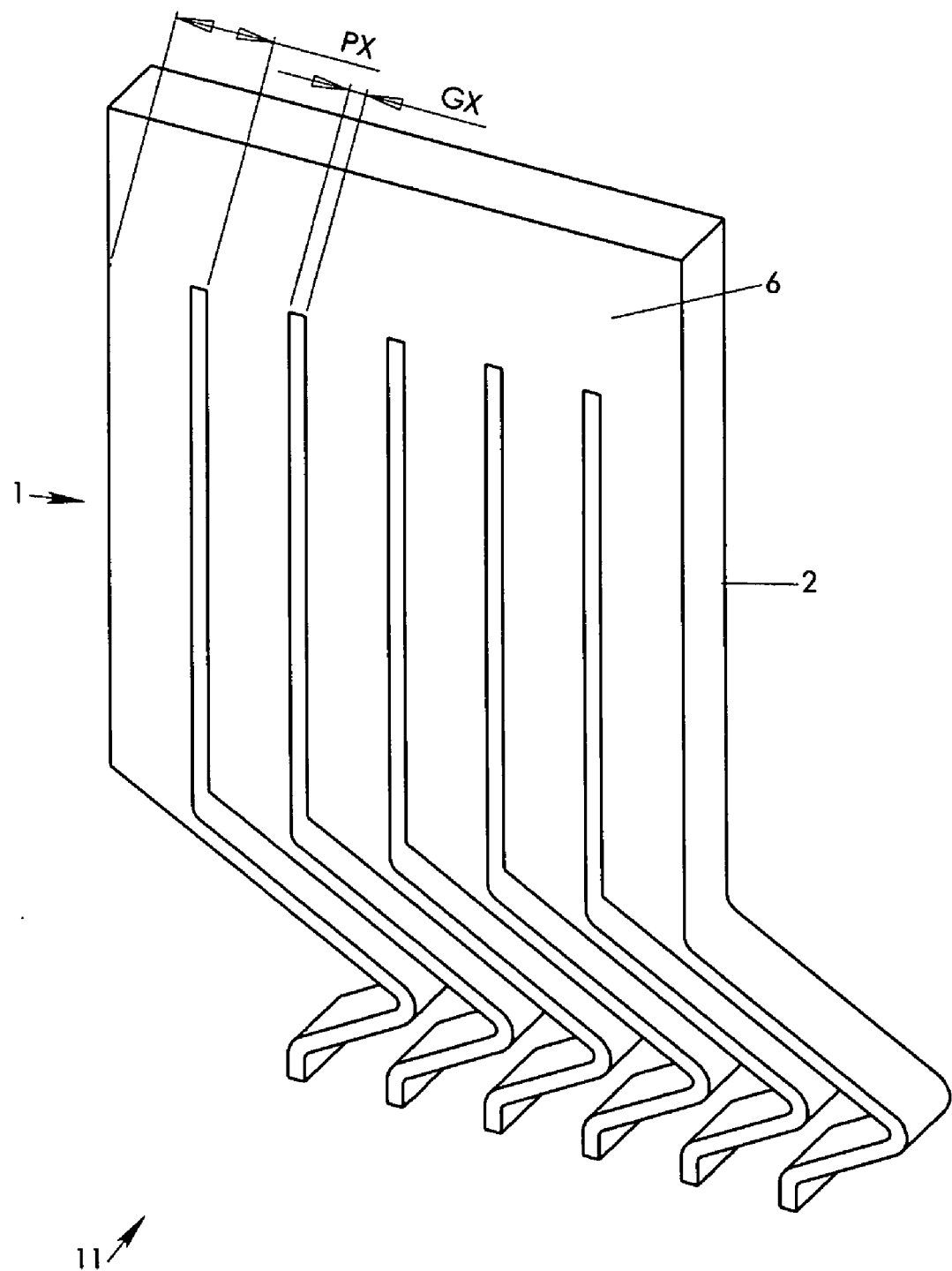
FIG. 8 is a third perspective view of an exemplary probe comb of a number of linearly arrayed probes combined by a bridge.
Figure 9:
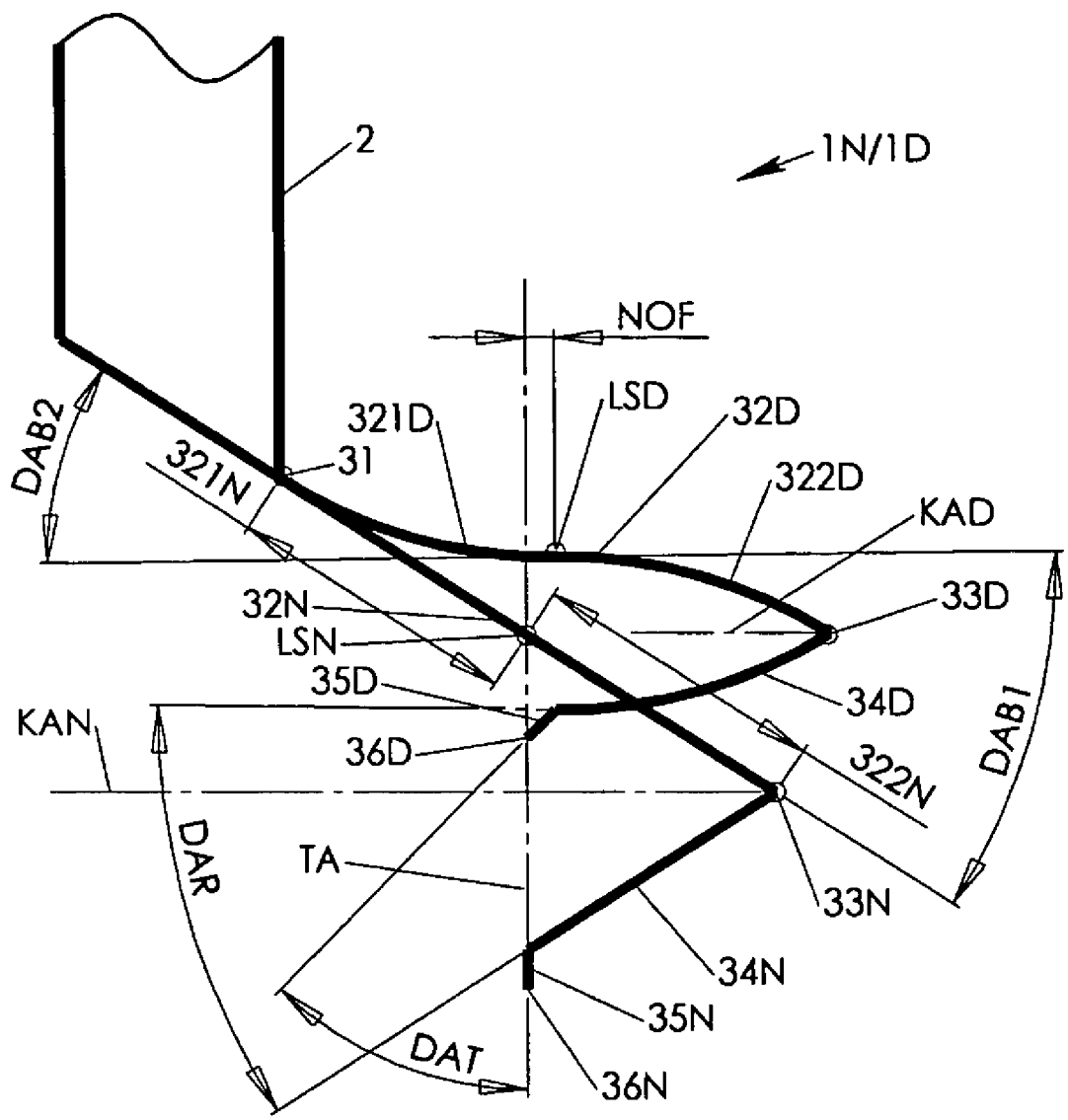
FIG. 9 is a schematic front view of a suspension knee in deflected and non deflected condition.
Figure 10:
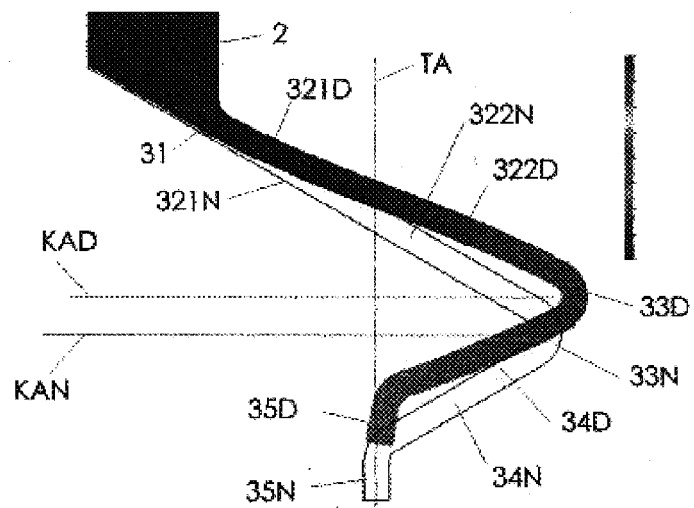
FIGS. 10, 12, 14, 16, 17, 19 are colored front views of spectral displacement plots of variously configured suspension knees.
Figure 11:
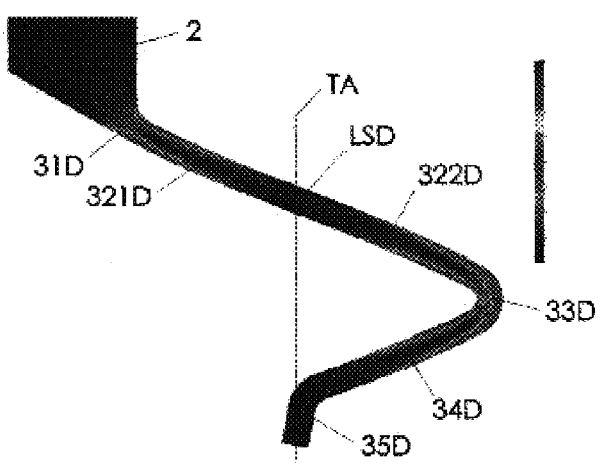
FIG. 11 is a colored front view of a spectral stress plot of the suspension knee of FIG. 10.

To facilitate the assembly of large numbers of probes 1, a number of probes 1 may be simultaneously fabricated as a probe comb 11 as illustrated in the example of FIG. 8. The probe comb 11 is held together by a probe bridge 6 connected to each of the arrayed probes' 1 peripheral end 21. A number of probe combs 11 may be stacked with second pitch PY in protrusion direction of the probe comb 11, forming large two dimensional probe arrays. Individual probe combs 11 may be spaced apart by spacers that provide second gaps GY. The probe combs 11 may be held in alignment along second pitch PY direction by surrounding frame structures and/or by form features on both sides of the spacers. The form features may fit into the gaps GX. The probe combs 11 may alternately be assembled by inserting them with there probe bridges 6 in correspondingly shaped grooves of a template plate (not shown).

After the probe combs 11 are positioned with respect to each other, they may be fixed by use of a resin filled into the gaps between the probes 1. After curing of the resin, the probe bridges 6 may be removed and the individual probes 1 conductively accessed as described above.

Suspension connect 31, base arm 32, knee bend 33, reverse arm 34, and contacting tip 35 may have various tuned configurations resulting in varying scrub motions. Referring to FIGS. 9–13 a first tuned configuration is described in which a lateral scrub motion with respect to the tip axis TA is substantially zero. In FIGS. 9–19, numerals pertaining to the deflected elements of the suspension knee 3 have a suffix letter D, whereas numerals pertaining to non deflected elements of the suspension knee 3 have a suffix letter N. A contacting force resulting from the operative approach of the contacting tip 35 on a test contact 210 (see FIGS. 20, 21) may act upon the contacting face 36N/36D along the tip axis TA. Where the tip axis TA crosses the base arm 32N/32D, the base arm 32N/32D has its local bending stresses at a minimum as can be seen in the spectral stress plots of FIGS. 11, 13 and 15, 18. At these low stress regions LS, LSN/LSD, the central base arm portion 321N has its maximum angular central base arm deflection DAB1 with respect to the central base arm portion's 321N natural orientation and the peripheral base arm portion 322D has its maximum angular peripheral base arm deflection DAB2 with respect to the peripheral base arm portion's 322N natural orientation. This is because a first bending moment acting on the central base arm portion 321N/321D is opposing a second bending moment acting on the peripheral base arm portion 322N/322D. According to FIG. 9, the first bending moment and the second bending moment act counter clock wise or generally speaking in direction away from the upper portion of the column axis CA. The first bending moment hinges thereby on the suspension connect 31 and the second bending moment hinges on the knee bend 33.

A third bending moment acts on the reverse arm 34N/34D hinging on the knee bend 33 generally in direction opposite the second bending moment. According to FIGS. 10, 11, the third bending moment acts clock wise. First, second and third bending moments result from the contacting force as may be well appreciated by anyone skilled in the art. The third bending moment results in a maximum angular reverse arm deflection DAR with respect to the reverse arm's 34N natural orientation.

The first tuned configuration includes dimensional and structural configurations of suspension connect 31, central base arm portion 321, peripheral base arm portion 322, knee bent 33 and reverse arm 34 such that maximum local angular deflections DAB1, DAB2 and DAR are substantially equal. An indication for the first tuned configuration is that the natural knee axis KAN of the non deflected suspension knee 3 is substantilly parallel to the deflected knee axis KAD of the operationally deflected suspension knee 3.

During deflection of the central base arm portion 321N/321D a lateral offset NOF may be introduced to the remainder of the suspension knee 3 due to the geometric conditions and geometric relations of the deflected and non deflected central base arm portion 321N/321D as may be well appreciated by anyone skilled in the art. The contacting tip 35 may be configured in length and deflection behavior such that the lateral offset NOF may be substantially compensated for. At the contacting face 36D, the contacting tip 35D may consequently have a maximum angular tip deflection DAT contributing to the scrub motion. Hence, in the first tuned configuration, the scrub motion includes substantially only angular movement of the contacting face 36.

Figure 12:
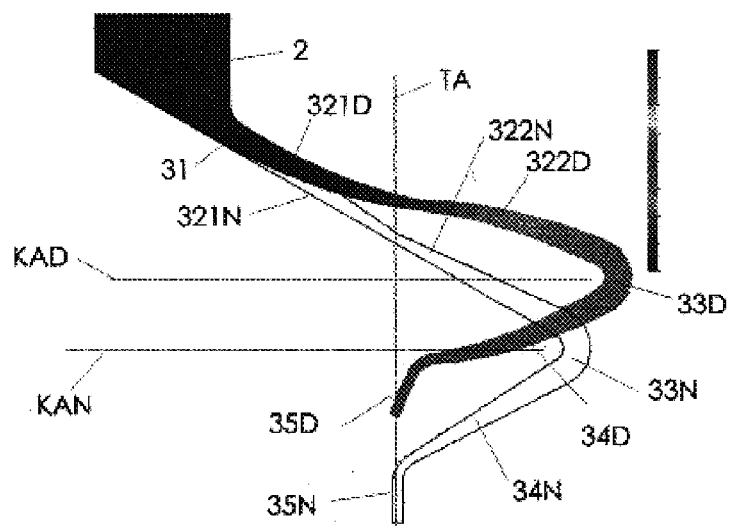
Figure 13:
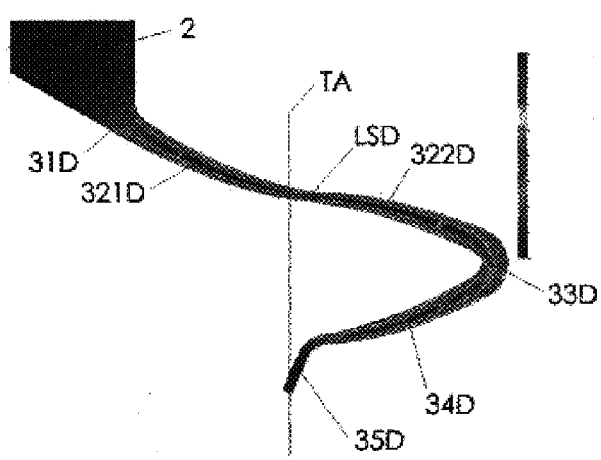
FIG. 13 is a colored front view of a spectral stress plot of the suspension knee of FIG. 12.

For a required contacting force, the operational deflection of the suspension knee 3 may be adjusted by configuring the elements of the suspension knee 3 for a leveled stress maxima as can be seen in the FIGS. 12, 13. There, the cross sections are adjusted with continuous thickness TH such that stress maxima propagate highly continuous along suspension connect 31, central and peripheral base arm portions 321, 322, knee bend 33, reverse arm 34 and contacting tip 35. Optimizing the suspension knee 3 with constant thickness TH is particularly preferred in combination with continuous profile of probe 1 and fabrication techniques layered in profile direction such as well known electroplating in combination with a negative mask corresponding to the contour of the probe's 1 continuous profile. Nevertheless, ,the suspension knee 3 may also be optimized by varying the thickness TH as may be well appreciated by anyone skilled in the art.

Figure 14:
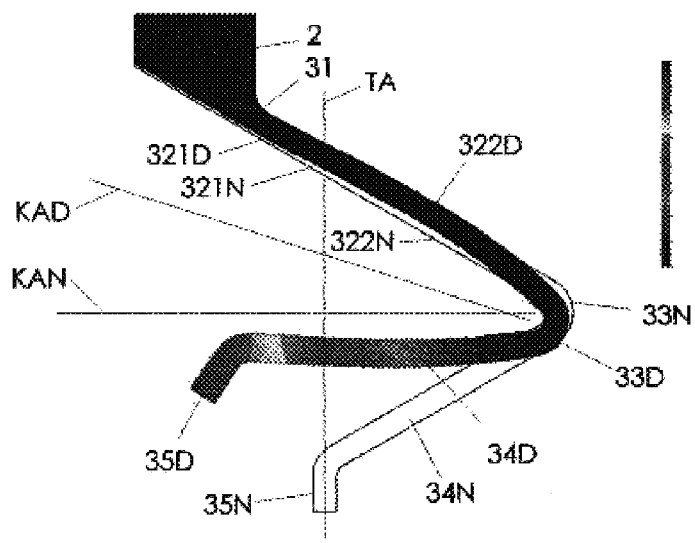
Figure 15:
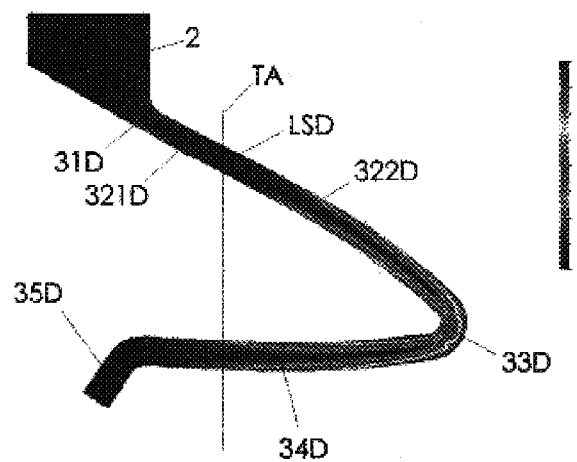
FIG. 15 is a colored front view of a spectral stress plot of the suspension knee of FIG. 14.
Figure 16:
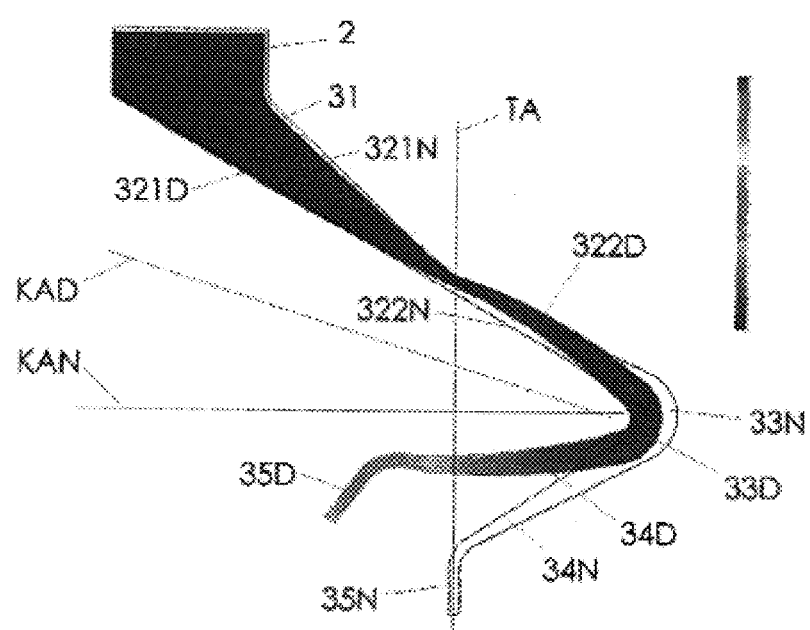

Referring to FIGS. 14–16, a second tuned configuration of the suspension knee 3 provides a scrub motion in direction towards the column axis CA. According to FIGS. 14 and 15, the second tuned configuration may be provided for a continuously shaped base arm 32 by extending the reverse arm 34 such that the tip axis TA divides the base arm into a central base arm portion 321 that is shorter than the peripheral base arm portion 322. Consequently, the maximum angular deflection DAB1 of central arm portion 321D is smaller than the maximum angular deflection DAB2 of the peripheral arm portion 322D. Since base arm 32 and reverse arm 34 have substantially equal and continuous cross sections, DAB2 is equal DAR. The summary of DAB1, DAB2 and DAR results generally in a tilt of the displaced knee axis KAD in direction away from the upper portion of the column axis CA. With respect to FIGS. 14 and 16, the displaced knee axis KAD is tilted in clockwise direction with respect to the natural non deflected knee axis KAN. The resulting lateral scrub motion is in direction towards the central axis CA. FIG. 15 depicts the corresponding stresses.

The same condition of DAB1 being smaller than DAB2 with DAB2 being equal to DAR is depicted in FIG. 16. There, the central base arm portion 321 is configured with larger bending stiffness than the peripheral base arm portion 322. Even though the tip axis TA is at a distance to CA equal to the above described first tuned condition of FIGS. 9–13, the dissimilar structural configuration of both base arm portions 321, 322 is the prevailing condition determining the direction and magnitude of the scrub motion.

Figure 17:
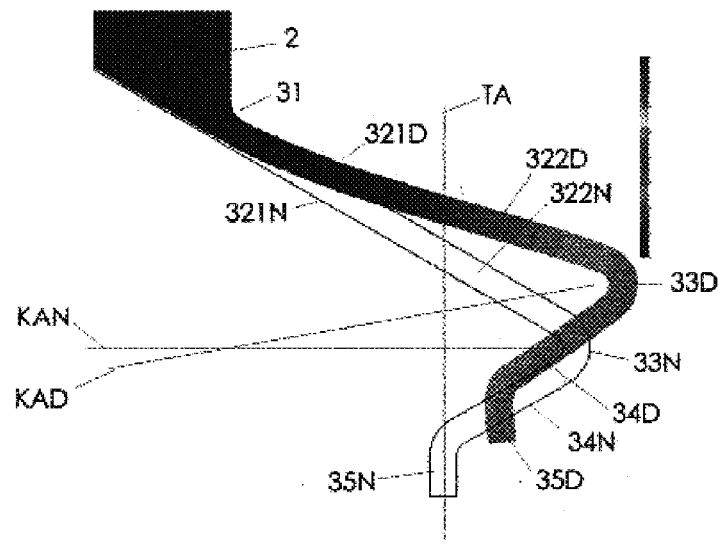
Figure 18:
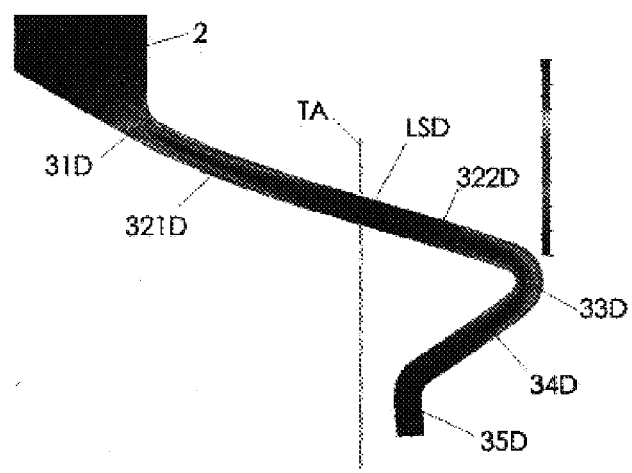
FIG. 18 is a colored front view of a spectral stress plot of the suspension knee of FIG. 17.

The teachings of FIGS. 14–16 may be inverted to obtain a third tuned configuration in which the scrub motion is in direction away from the central axis CA as may be well appreciated by anyone skilled in the art. Accordingly and as shown in FIGS. 17, 18, the suspension knee 3 is configured with the tip axis TA dividing the base arm 32 in a central base arm portion 321 that is longer than the peripheral base arm portion 322. Despite continuous cross sections of base arm 32 and reverse arm 34, DAB1 being larger than DAB2 results in a scrub motion away from the central axis CA irrespective of DAB2 being equal to DAR, which is illustrated in FIG. 17 by the deflected knee axis KAD being rotated in counter clockwise direction with respect to the natural knee axis KAN or generally speaking, in the third tuned configuration the deflected knee axis KAD is rotated with respect to the natural knee axis KAN in direction towards the upper portion of the column axis CA.

Figure 19:
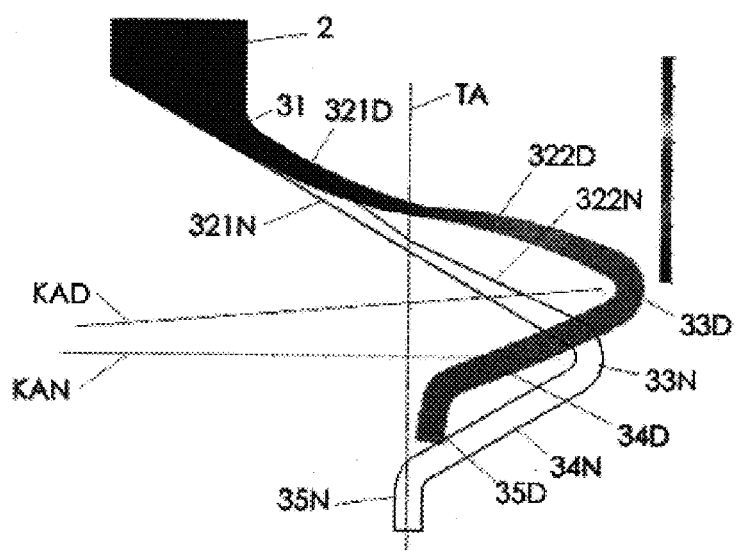

Second or third tuned configuration may be obtained also by adjusting the reverse arm's 34 deflection behavior in conjunction with the peripheral base arm portion's 322 deflection behavior as illustrated in FIG. 19. There, the base arm portions 321, 322 are configured with equal deflection behavior such that DAB1 equals DAB2. The reverse arm 34 on the other hand is stiffer than the peripheral arm portion 322 resulting in DAR being smaller than DAB2 and consequently a third tuned configuration with a linear scrub motion away from the central axis CA. In case, the reverse arm 34 would be less stiff than the peripheral base arm portion 322, the second tuned configuration would be established with the linear scrub motion towards the central axis CA.

As may be well appreciated by anyone skilled in the art, the teachings presented under the FIGS. 9–19 may be well applied to configure various shapes of the suspension knee's 3 elements. Further more, the contacting force represented in the Figures by the tip axis TA may be adjusted in angle with respect to the column axis CA. Consequently, for a given geometry of the suspension knee 3, first, second or third tuned configuration may be provided by assembling the probe 1 with its column axis CA in predetermined angle with respect to the contacting force defined by the probe apparatus in conjunction with the test contact 210 (see FIGS. 20, 21) as may be well appreciated by anyone skilled in the art. For example, the probe 1 may be provided with a first tuned configuration in case of the tip axis TA being parallel to the column axis CA. Tilting such probe 1 in direction towards its knee 33 may result in a second tuned configuration whereas a tilting of such probe 1 in direction away from its knee 33 may result in a third tuned configuration. Tilting the probe 1 may be a convenient technique of fine tuning the linear scrub motion in direction and magnitude without need to remanufacture the probe 1.

Figure 20:
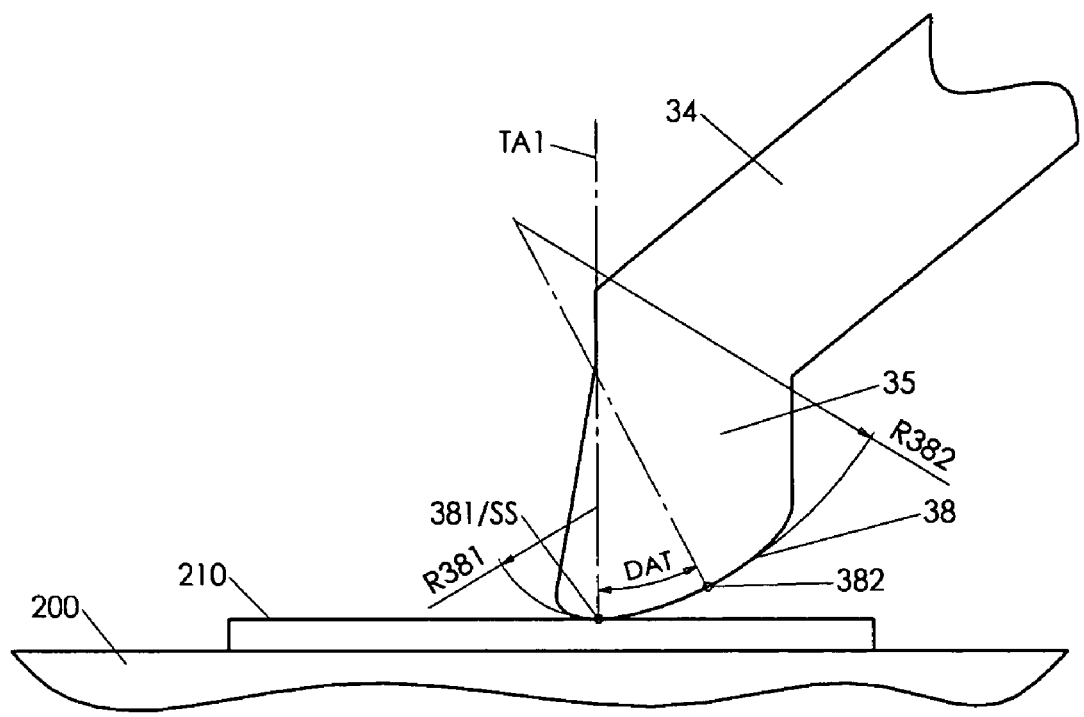
FIG. 20 is a front view of a multiradius contacting tip in initial contact with a test contact.
Figure 21:
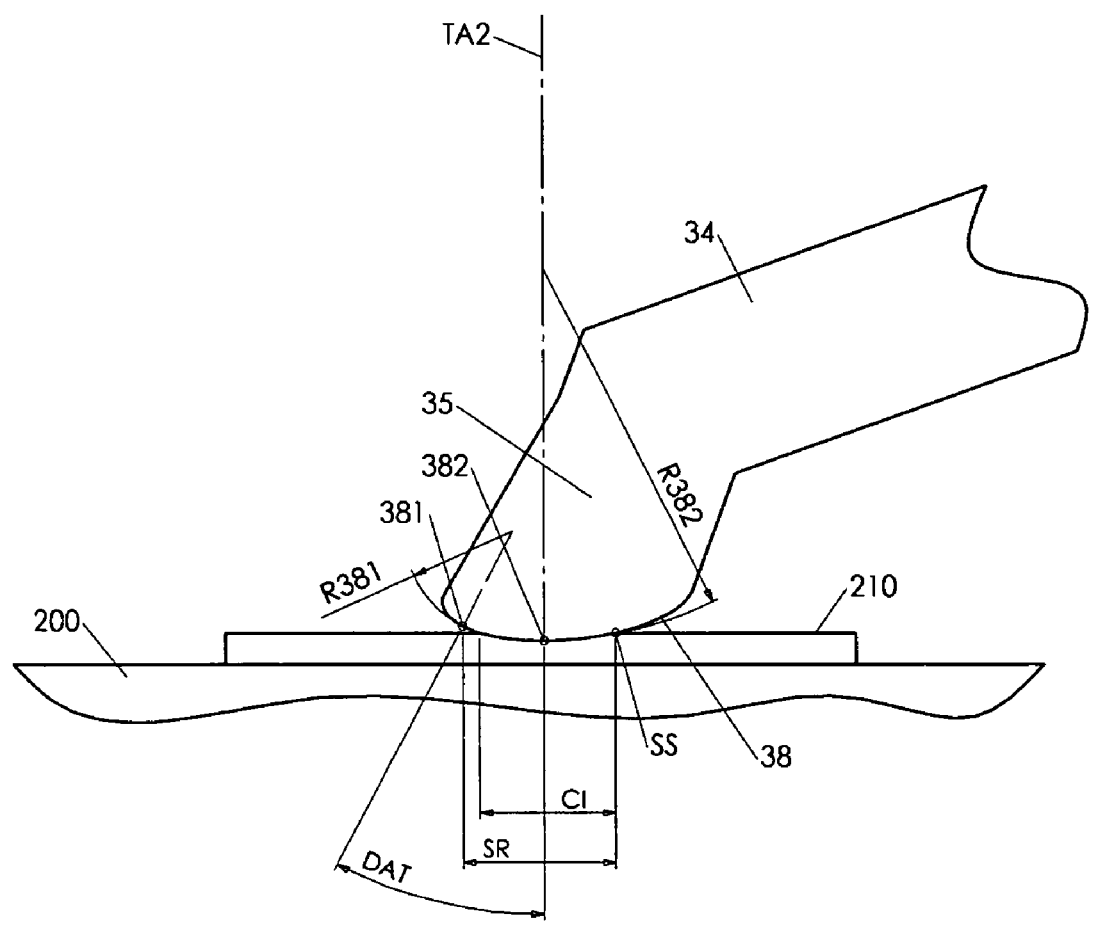
FIG. 21 is the front view with the multiradius contacting tip of FIG. 20 in operational contact with the test contact of FIG. 20.

As taught under FIGS. 9–19, scrub motion may be adjusted for its lateral movement component in direction and, magnitude and for its angular movement component in magnitude as may be well appreciated by anyone skilled in the art. The advantageous combination of angular and lateral scrub motion adjustability may be combined with a multi-radius contacting face 38 as illustrated in FIGS. 20, 21. The multiradius contacting face 38 may have at least a first contacting radius R381 (i.e., a radius of curvature) at the initial contacting region 381 where the multiradius face 38 initially contacts the test contact 210 of a tested electronic device 210. An initial tip axis TA1 may origin in the initial contacting region 381.

As the probe 1 is brought into operational deflection with respect to the test contact 210, the multiradius face 38 may be rotated with maximum tip deflection angle DAT such that an operational contacting region 382 comes into contact with the test contact 210. An operational tip axis TA2 may origin from the central interface between operational contacting region 382 and the test contact 210. Between initial contacting at scrub start location SS and operational contacting, the multiradius face 38 prescribes a lateral scrub SL and an angular scrub equal DAT. Orientation of TA1 and TA2 may be affected by friction in the tip/contact interface CI as may be well appreciated by anyone skilled in the art.

The operational contacting region 382 has second contacting radius R382 (i.e., a radius of curvature) substantially larger than first contacting radius R381. The multiradius face 38 hence features at least two radii R381, R382 that contribute to a smooth and continuously varying curvature of the multiradius face 38. The two radii R381, R382 may be selected in conjunction with the change of contacting force as a function of angular tip displacement such that contacting pressure in the tip/contact interface CI remains within a predetermined limit.

Figure 22:
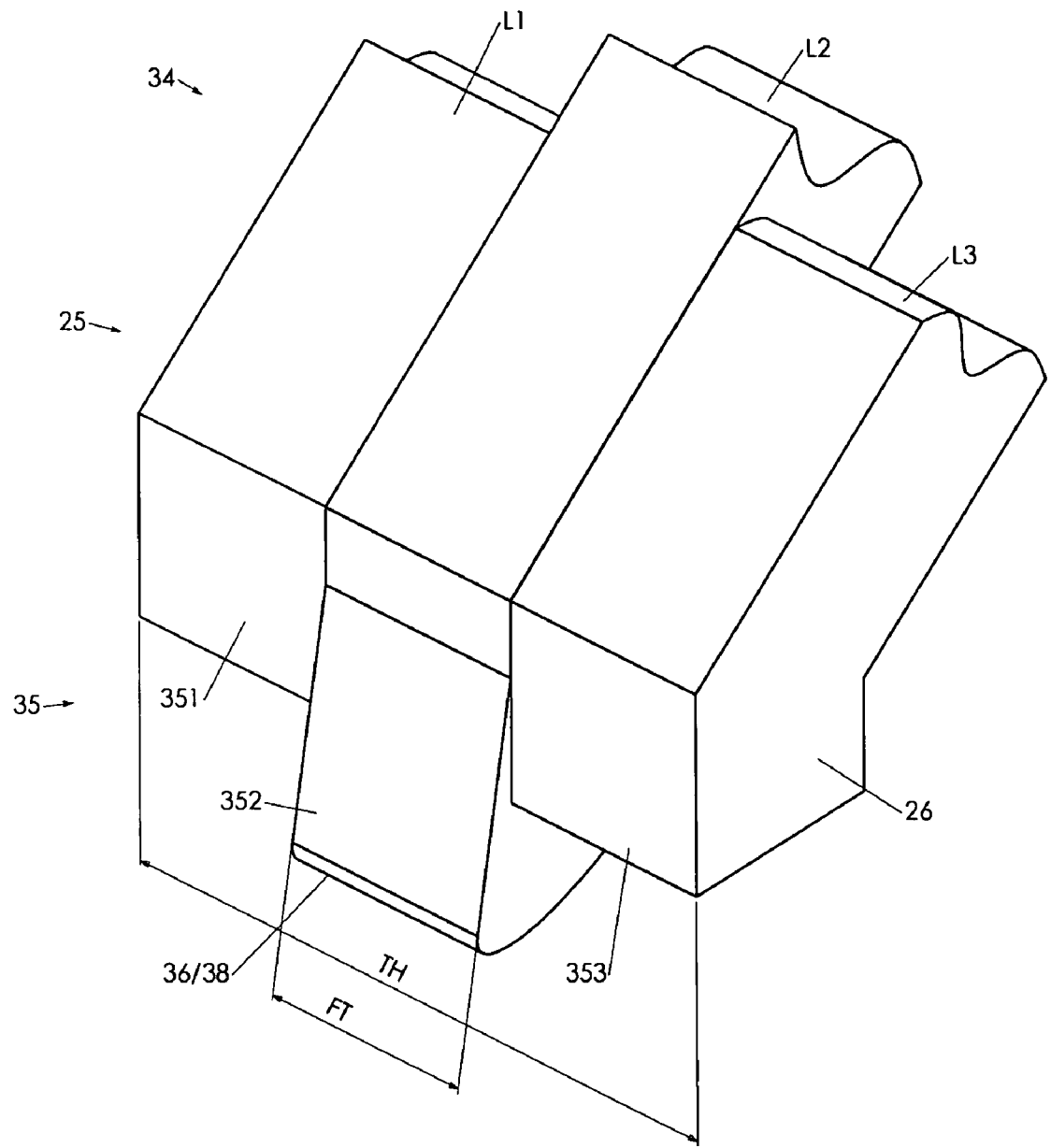
FIG. 22 is a fourth perspective view of a contacting tip with three tip segments.

Referring to FIG. 22, area of and pressure in the tip/contact interface CI may also be adjusted by varying the contacting face thickness FT to levels less than the probe thickness TH. Also, the contacting tip 35 may be split into tip segments 351, 352, 353 of which one or more may provide contacting face(s) 36 or 38. For that purpose, the probe 1 may be fabricated from a number of layers L1, L2, L3 deposited in multiple steps for example by electroplating in combination with multiple masks as may be well appreciated by anyone skilled in the art. The layers L1, L2, L3 may partially and/or fully extend across the probe's 1 profile contour and may be made of materials suitable for their particular task. For example, the layer L2 illustrated in FIG. 22 with the contacting face 36 may be fabricated from a material specifically suitable for probe tips such as rhodium. A single contacting face 36 or 38 may be placed centrally as shown in FIG. 22. Alternatively, dual contacting faces 36 or 38 may be provided by tip segments 351, 353, one adjacent the front face 25 and the other adjacent the back face 26. This may also assist in stabilizing the suspension knee's 3 deflection behavior within the symmetry plane SP and to reduce the risk of inadvertent lateral scrub motion deviations.

The contacting tips 351, 352, 353 may be arranged in a tripod like fashion with each contacting segment having a contacting face 36 or 38 for providing a self centering contacting on a test contact in the well known spherical configuration. The suspension knee 3 may be layered in direction along the symmetry plane S P. The layer configuration may also be adjusted in view of low surface resistance for high frequency current flow from the contacting tip 36 or 38 to the peripheral end 21 or the column 2. Tip segments 351, 352 and 353 may also be fabricated from same material resulting in a monolithic structure.

The spectral plots of FIGS. 10–19 are generated with a commercially available FEA software.

Accordingly, the scope of the invention described in the specification above is set forth the following claims and their legal equivalent.

What is claimed is:

1. An electrical probe comprising:
   a. a rigid columnar structure extending between a peripheral end and a connect end along a central column axis;
   b. a suspension knee having:
      I. a base arm laterally connecting to said connect end and extending away from said column axis substantially to a lateral knee extension;
      II. a reverse arm continuing from said base arm extending from said lateral knee extension toward said column axis, but not reaching said column axis;
      III. a contacting tip at the end of said reverse arm, said contacting tip having a contacting face with a central tip axis having a non-zero tip offset relative to said column axis, wherein said tip is disposed at a location between said lateral knee extension and said column axis;
   wherein said tip offset is smaller than said lateral knee extension such that during application of a contacting force along said tip axis a first deflection of said base arm and a second deflection of said reverse arm counteract resulting in a predetermined scrub motion of said contacting tip; and wherein said suspension knee is freely suspending.

2. The probe of claim 1 being symmetric with respect to a symmetry plane through said column axis and said tip axis such that said scrub motion is substantially in plane with said symmetry plane.

3. The probe of claim 2 being arrayed in a probe array together with multiple representations along said symmetry plane with a first pitch substantially smaller than a total width of said probe.

4. The probe of claim 3, wherein said probe array is a probe comb held together via a probe bridge connected to each of said arrayed probes' peripheral end.

5. The probe of claim 2 having a continuous profile in direction perpendicular to said symmetry plane such that said columnar structure has a substantially rectangular cross section with a first pair of adjacent faces and a second pair of adjacent faces, said first pair opposing said second pair.

6. The probe of claim 5 fixedly held in a probe assembly including:
   a. a fixture plate having a fixing cutout with a contour larger than said rectangular cross section, said fixture cutout having two fixing faces corresponding to said first pair of adjacent faces;
   b. a clamping plate having a clamping cutout with a contour larger than said rectangular cross section, said clamping cutout having two clamping faces corresponding to said second pair of adjacent faces;
   wherein said clamping plate may be held in an assembly position and an clamping position offset in a clamp angle with respect to said assembly position;
   wherein in said assembly position said clamping cutout aligns with said fixing cutout such that said columnar structure may be inserted in said fixing cutout and said clamping cutout; and
   wherein in said clamping position said first pair of adjacent faces is forced into snug contact with said fixing faces and said second pair of adjacent faces is forced into snug contact with said clamping faces.

7. The probe of claim 5 being fabricated by electroplating in combination with a negative mask corresponding to said continuous profile.

8. The probe of claim 1, wherein said base arm is substantially linearly protruding in a base arm angle with respect to a natural knee axis through the center of a knee bend interposed between said base arm and said reverse arm.

9. The probe of claim 1, wherein said reverse arm is substantially linearly protruding between said contacting tip and a knee interposed between said base arm and said reverse arm, said reverse arm protruding in a reverse arm angle with respect to a natural knee axis through the center of said knee.

10. The probe of claim 1, wherein said base arm and said reverse arm have a first tuned configuration such that a lateral movement component of said scrub motion is substantially zero.

11. The probe of claim 1, wherein said base arm and said reverse arm have a second tuned configuration such that a lateral movement component of said scrub motion is towards said column axis.

12. The probe of claim 1, wherein said base arm and said reverse arm have a third tuned configuration such a lateral movement component of said scrub motion is away from said column axis.

13. The probe of claim 1 being part of a probe apparatus for testing electronic circuitry.

14. The probe of claim 1 wherein said contacting tip comprises a multiradius contacting face including an initial contacting region where said multiradius contacting face initially contacts and an operational contacting region where said multiradius contacting face contacts during operational deflection and during a maximum tip deflection angle; and
   wherein said initial contacting region has a first curvature and said operational contacting region has a second curvature different from said first curvature.

15. The probe of claim 14, wherein said multiradius contacting face is part of a tip segment, and wherein said tip segment and said contacting face both have a thickness less than a thickness of said probe.

16. The probe of claim 15, wherein said tip segment comprises an electrical contact layer.

17. The probe of claim 16, wherein said electrical contact layer is rhodium.

18. The probe of claim 15, wherein said first curvature is substantially larger than said second curvature.

19. The probe of claim 15, wherein said tip segment is centrally placed within said contacting tip.

20. The probe of claim 15, wherein a first representation of said tip segment is placed adjacent a front face of said probe and wherein a second representation of said tip segment is placed adjacent a back face of said probe.

21. The probe of claim 1, wherein said contacting tip is split into three tip segments arranged in a tripod like fashion such that said contacting tip self centers on a spherical contact.

* * * * *